United States Patent
Kang

(10) Patent No.: US 8,705,312 B2
(45) Date of Patent: Apr. 22, 2014

(54) CLOCK SIGNAL GENERATION APPARATUS FOR USE IN SEMICONDUCTOR MEMORY DEVICE AND ITS METHOD

(71) Applicant: 658868 N.B. Inc., St. John (CA)

(72) Inventor: Tae-Jin Kang, Kyoungki-do (KR)

(73) Assignee: 658868 N.B. Inc., St. John, NB (CA)

( * ) Notice: Subject to any disclaimer, the term of this patent is extended or adjusted under 35 U.S.C. 154(b) by 0 days.

(21) Appl. No.: 13/898,998

(22) Filed: May 21, 2013

(65) Prior Publication Data

US 2013/0250705 A1    Sep. 26, 2013

Related U.S. Application Data

(63) Continuation of application No. 13/367,023, filed on Feb. 6, 2012, now Pat. No. Re. 44,230, which is an application for the reissue of Pat. No. 7,212,465.

(30) Foreign Application Priority Data

Dec. 28, 2004  (KR) .................. 10-2004-0113615

(51) Int. Cl.
*G11C 8/00* (2006.01)

(52) U.S. Cl.
USPC ............... 365/233.1; 365/189.12; 365/230.06

(58) Field of Classification Search
USPC ................... 365/233.1, 230.06, 189.12, 194; 327/143, 284, 156
See application file for complete search history.

(56) References Cited

U.S. PATENT DOCUMENTS

| | | | |
|---|---|---|---|
| 6,834,014 B2* | 12/2004 | Yoo et al. | 365/230.06 |
| 7,102,958 B2* | 9/2006 | Lee et al. | 365/230.06 |
| 2010/0054053 A1* | 3/2010 | Lee et al. | 365/189.011 |

* cited by examiner

*Primary Examiner* — Gene Auduong

(57) ABSTRACT

A clock signal generation apparatus for generating a reference clock signal for outputting data in synchronization with an external clock signal from a semiconductor memory device, including: a clock signal generation unit for receiving an internal clock signal to generate the reference clock signal according to a control signal; and a control unit for generating the control signal based on a read command, a write command and an external address.

53 Claims, 6 Drawing Sheets

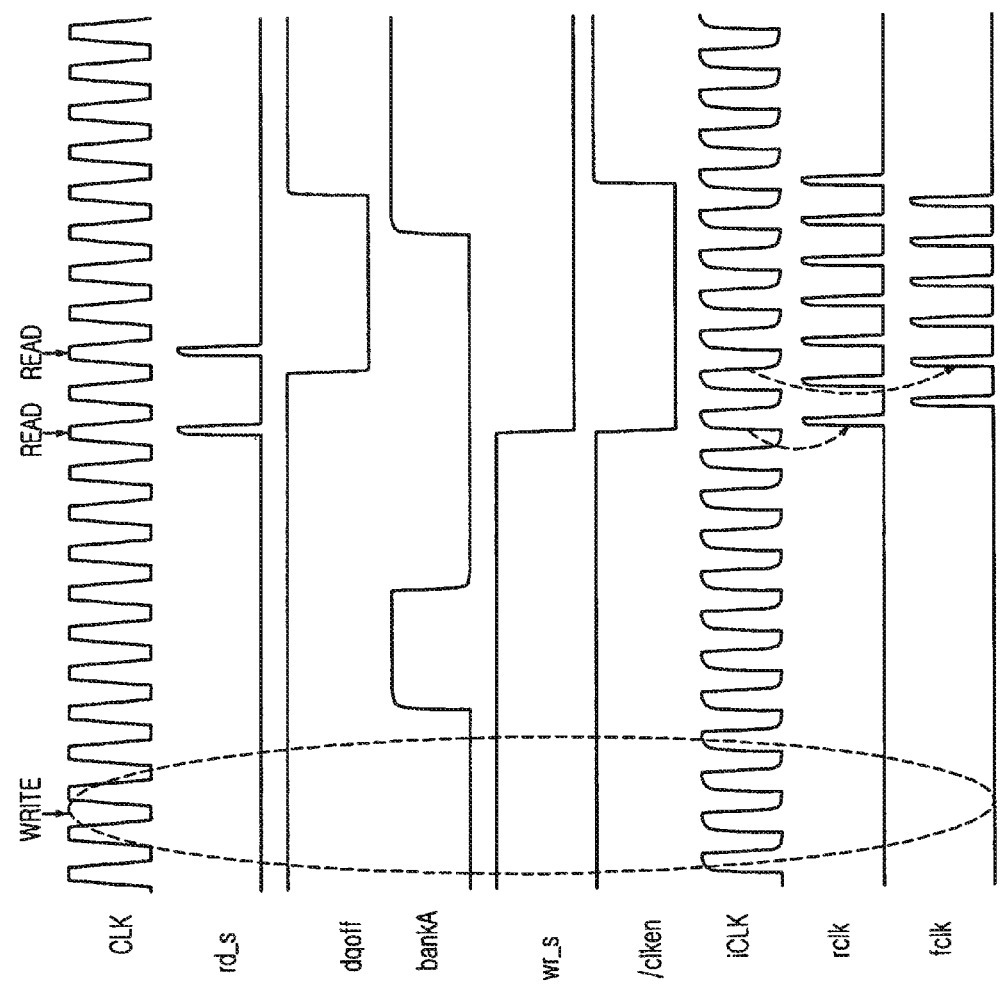

CLOCK SIGNAL GENERATION APPARATUS FOR USE IN SEMICONDUCTOR MEMORY DEVICE AND ITS METHOD

CROSS REFERENCE TO RELATED APPLICATIONS

More than one reissue application has been filed for the reissue of U.S. Pat. No. 7,212,465. This application is a Continuation Reissue of U.S. patent application Ser. No. 13/367,023, filed Feb. 6, 2012, which is a Reissue of U.S. patent application Ser. No. 11/077,612, filed Mar. 11, 2005, now issued as U.S. Pat. No. 7,212,465.

FIELD OF INVENTION

The present invention relates to a clock signal generation device; and, more particularly, to a clock signal generation device for reducing power consumption.

DESCRIPTION OF PRIOR ART

Generally, in an electronic circuit system such as a computer system, a clock signal is used as a reference signal for controlling timings of performing various operations. However, when an external clock signal inputted to a semiconductor memory device is converted into an internal clock signal of the semiconductor memory device, a clock skew between the external clock signal and the internal clock signal is generated. Therefore, when data are outputted from the semiconductor memory device, the data cannot be synchronized with the external clock signal due to the clock skew. Therefore, a delay locked loop (DLL) is employed for solving the above-mentioned problem.

FIG. 1 is a block diagram showing a conventional synchronous dynamic random access memory (DRAM) including a DLL.

As shown, the DLL includes a clock buffer 111, a phase detector 112, a delay line controller 113, a delay line 114 and a delay monitor 115.

The clock buffer 111 buffers an external clock signal CLK to generate an internal clock signal iCLK. The phase detector 112 compares a phase of the internal clock signal iCLK with a phase of a feed-backed clock signal outputted from the delay monitor 115 to thereby generate a shift right control signal SR and a shift left control signal SL based on the comparison result. The phase detector 112 also generates a delay locking signal dll_lockb when a delay locking operation of the DLL is completed.

The delay line 114 receives the internal clock signal iCLK to generate a rising DLL clock signal rclk_dll and a falling DLL clock signal fclk_dll by delaying the internal clock signal iCLK. The delay line controller 113 controls a delay amount added to the internal clock signal iCLK according to the shift right control signal SR and the shift left control signal SL.

The delay monitor 115 delays the rising and the falling DLL clock signals rclk_dll and fclk_dll for a predetermined delay time in order to compensate a flight time generated while a data is passed to a data output pad (DQ pad) after the data is synchronized with the rising DLL clock signal rclk_dll or the falling DLL clock signal fclk_dll. Herein, the delay monitor 115 includes a dummy clock buffer, a dummy output buffer and a dummy load.

FIG. 2 is a timing diagram showing an operation of the conventional DRAM shown in FIG. 1.

As shown, data outputted from a DRAM core are synchronized with the rising DLL clock signal rclk_dll and the falling DLL clock signal fclk_dll in a data latch unit, and then the data are passed to the DQ pad to be outputted through the DQ pad in synchronization with a rising edge and a falling edge of the external clock signal CLK. That is, the rising DLL clock signal rclk_dll and the falling DLL clock signal fclk_dll are used as reference clock signals so that the data can be outputted in synchronization with the external clock signal CLK.

However, according to the conventional synchronous DRAM, even when a DLL clock signal is not needed, i.e., even when a data access operation is not performed, the DLL is continuously operated while the conventional synchronous DRAM is activated. Accordingly, it is difficult to reduce power consumption since the DLL continues to operate even when the DLL clock is not needed. In addition, particularly, it may be difficult to apply the conventional DRAM to a low-power mobile device due to the above-mentioned problem.

SUMMARY OF INVENTION

It is, therefore, an object of the present invention to provide a clock signal generation device capable of generating a reference clock signal only when the reference clock signal is required for outputting data in synchronization with an external clock signal without using a delay locked loop (DLL).

In accordance with an aspect of the present invention, there is provided a clock signal generation apparatus for generating a reference clock signal for outputting data in synchronization with an external clock signal from a semiconductor memory device, including: a clock signal generation unit for receiving an internal clock signal to generate the reference clock signal according to a control signal; and a control unit for generating the control signal based on a read command, a write command and an external address.

In accordance with another aspect of the present invention, there is provided a method for generating a reference clock signal for outputting data in synchronization with an external clock signal from a semiconductor memory device, including the steps of: generating a control signal based on a read command, a write command and an external address; and generating the reference clock signal based on an internal clock signal in response to the control signal.

BRIEF DESCRIPTION OF THE DRAWINGS

The above and other objects and features of the present invention will become apparent from the following description of preferred embodiments taken in conjunction with the accompanying drawings, in which:

FIG. 7 is a timing diagram showing operations of the semiconductor memory device shown in FIG. 3.

DETAILED DESCRIPTION OF INVENTION

Hereinafter, a clock signal generation device in accordance with the present invention will be described in detail referring to the accompanying drawings.

Figure 1:
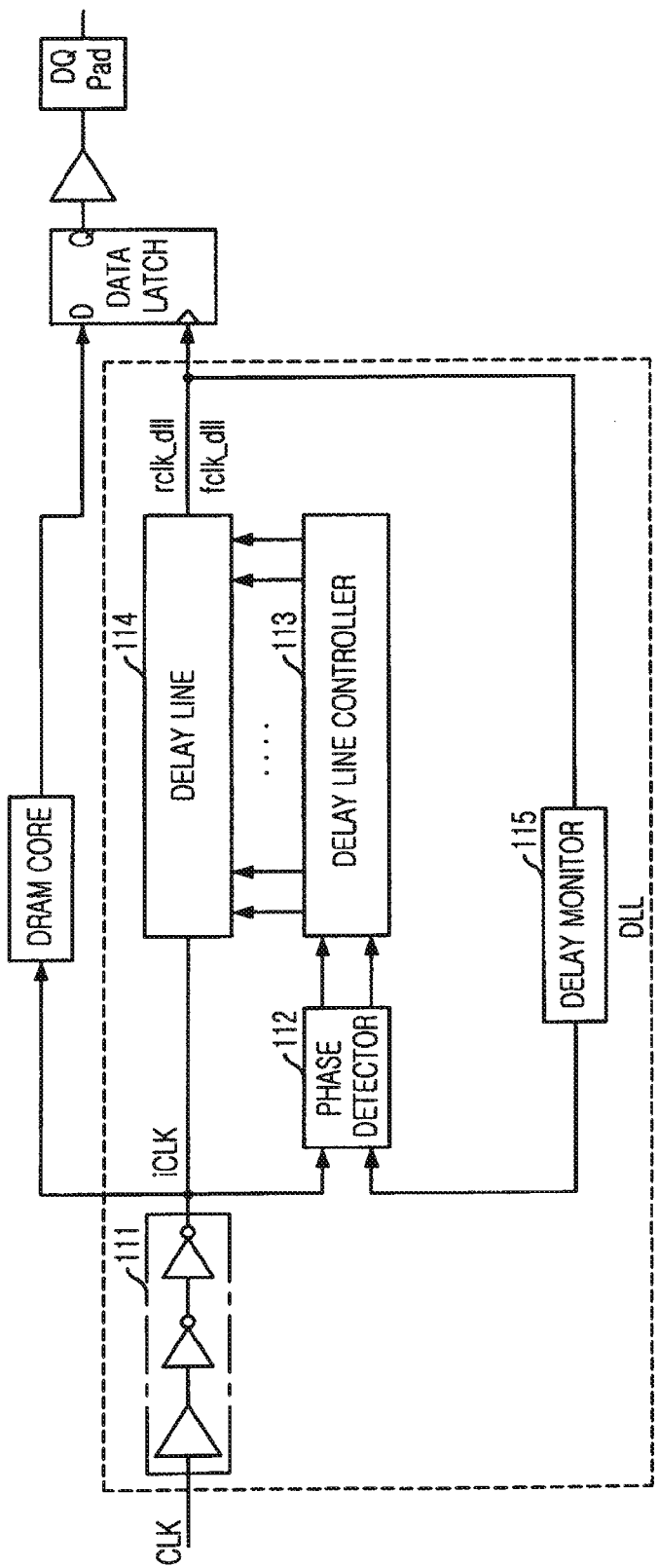
FIG. 1 is a block diagram showing a conventional dynamic random access memory (DRAM)
Figure 2:
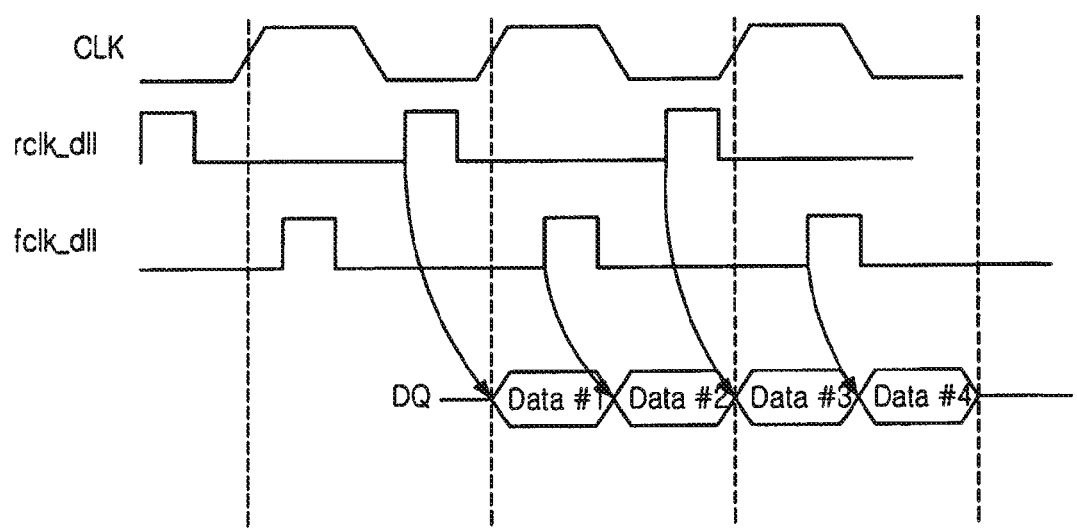
FIG. 2 is a timing diagram showing an operation of the conventional DRAM shown in FIG. 1.
Figure 3:
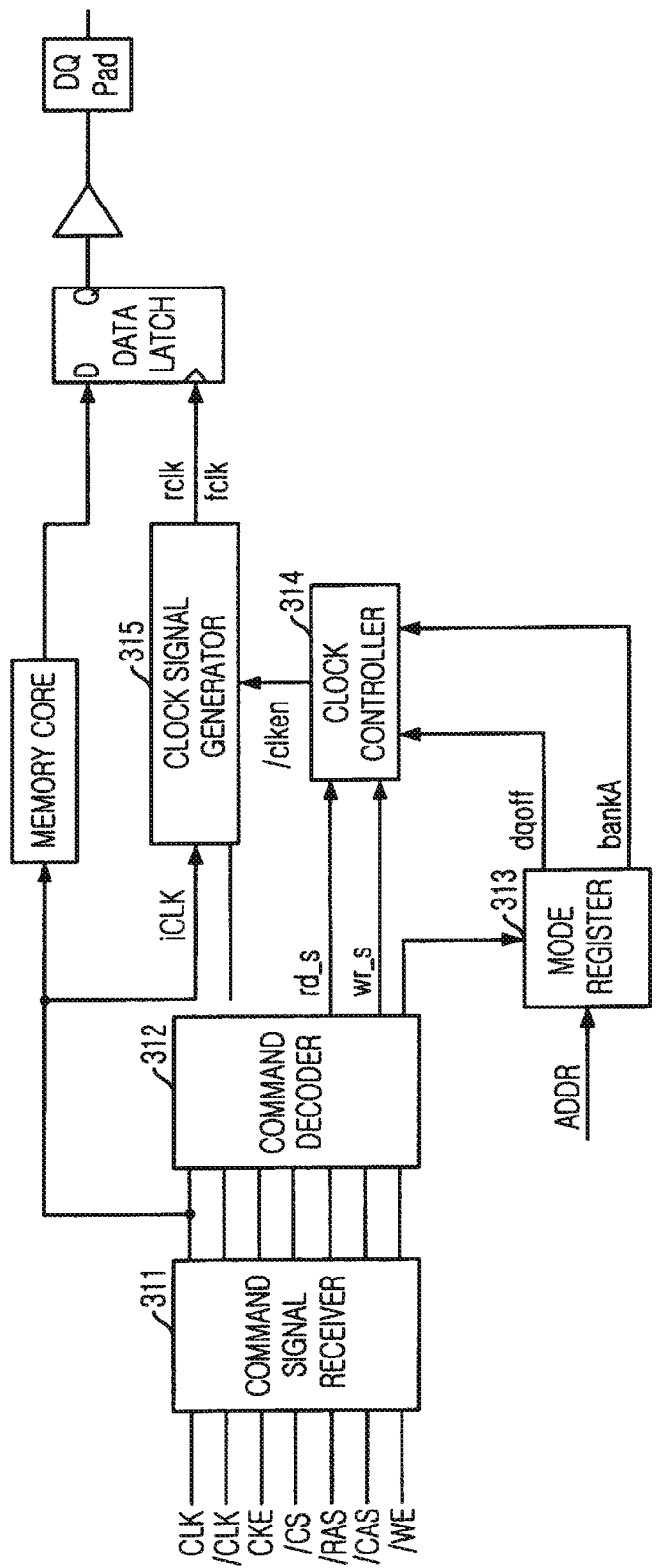
FIG. 3 is a block diagram showing a semiconductor memory device including a clock signal generation device in accordance with a preferred embodiment of the present invention.

FIG. 3 is a block diagram showing a semiconductor memory device including a clock signal generation device in accordance with a preferred embodiment of the present invention.

As shown, the semiconductor memory device includes a signal receiver 311, a command decoder 312, a mode register 313, a clock controller 314 and a clock signal generator 315.

The signal receiver 311 receives a plurality of command signals such as an external clock signal CLK, an external clock bar signal /CLK, a clock enable signal CKE, a chip selection bar signal /CS, a row address strobe (RAS) bar signal /RAS, a column address strobe (CAS) bar signal /CAS and a write enable bar signal /WE in order to transfer the received signals to the command decoder 312.

Herein, various operations of the semiconductor memory device according to the plurality of command signals are briefly described in a following table, where 'H' means logic high level and 'L' means logic low level.

TABLE 1

| command | /CS | /RAS | /CAS | /WE | BA | A10 (AP) | ADDR | NOTES |
|---|---|---|---|---|---|---|---|---|
| Deselect (NOP) | H | X | X | X | X | X | X | 2 |
| No operation (NOP) | L | H | H | H | X | X | X | 2 |
| Active (select bank and activate row) | L | L | H | H | V | Row | Row | |
| Read (select bank and column and start read burst) | L | H | L | H | V | L | Col | |
| Read with AP (read burst with auto-precharge) | L | H | L | H | V | H | Col | 3 |
| Write (select bank and column and start write burst) | L | H | L | L | V | L | Col | |
| Write with AP (write burst with auto-precharge) | L | H | L | L | V | H | Col | 3 |
| Burst terminate or enter deep power down | L | H | H | L | X | | | 4.5 |
| Precharge (deactivate row in selected bank) | L | L | H | L | V | L | | 6 |
| Precharge all (deactivate row in all bank) | L | L | H | L | X | H | | 6 |
| Auto precharge or enter self refresh | L | L | L | H | X | | | 7, 8, 9 |
| Mode register set | L | L | L | L | V | Op-code | | 10 |

The command decoder 312 decodes the plurality of command signals to generate a read signal rd_s and a write signal wr_s and to control the mode register set 313. When a read command for reading data from a memory core is inputted to the command decoder 312, i.e., when the chip selection bar signal /CS, the RAS bar signal /RAS, the CAS bar signal /CAS and the write enable signal /WE are inputted as 'L', 'H', 'L' and 'H' respectively, the command decoder 312 activates the read signal rd_s as a high pulse for a predetermined time. Similarly, when a write command for writing data to the memory core is inputted to the command decoder 312, i.e., when the chip selection bar signal /CS, the RAS bar signal /RAS, the CAS bar signal /CAS and the write enable signal /WE are inputted as 'L', 'H', 'L' and 'L' respectively, the command decoder 312 activates the write signal wr_s as a logic high level. Herein, the write signal wr_s is inactivated when the read command is inputted.

When an active command for activating a predetermined bank among a plurality of banks included in the semiconductor memory device is inputted, i.e., when the chip selection bar signal /CS, the RAS bar signal /RAS and the write enable bar signal /WE are inputted as 'L', 'L' and 'H' respectively and bank addresses BA0 and BA1 are inputted, the mode register 313 changes a logic level of a bank active signal bankA to a logic low level. That is, when one or more than one bank is activated, the bank active signal bankA becomes a logic low level. Otherwise, the bank active signal bankA is in a logic high level.

Meanwhile, the mode register 313 generates a data output off signal dqoff based on the read command inputted by the command decoder 312 and an external address signal AMR including the bank addresses BA0 and BA1. The data output off signal dqoff is in a logic high level at an initial state. If the read command is inputted the mode register 313, the data output off signal dqoff is changed to a logic low level after a CAS latency (CL). Then, the data output off signal dqoff keeps its logic level as a logic low level for a burst length (BL).

The clock controller 314 receives the read signal rd_s, the write signal wr_s, the data output off signal dqoff and the bank active signal bankA for generating a clock enable bar signal /clken. Herein, the clock enable bar signal /clken becomes a logic low level when the read signal rd_s is activated, and then the clock enable bar signal /clken is changed to a logic high level after a predetermined delay time (dT) is passed after the data output off signal dqoff is changed to a logic high level.

The clock signal generator 315 receives an internal clock signal iCLK for generating a rising clock signal rclk and a falling clock signal fclk while the clock enable bar signal /clken is a logic low level. Herein, the external clock signal CLK is outputted as the internal clock signal iCLK from the command signal receiver 311.

Figure 4:
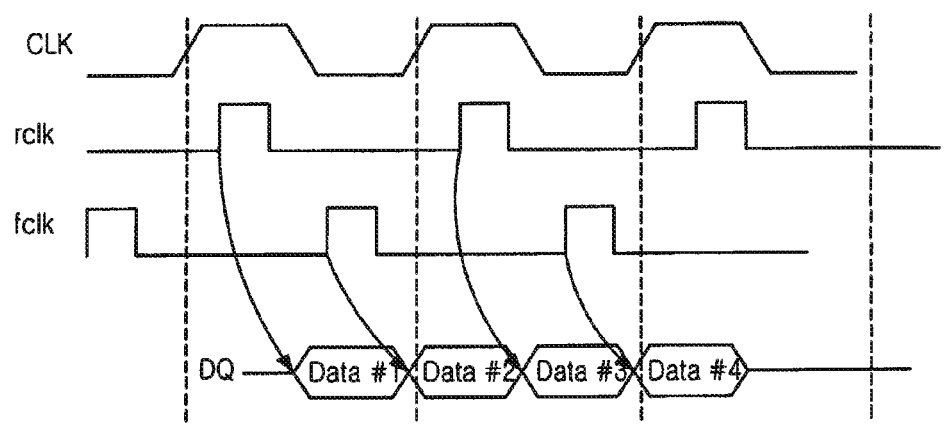
FIG. 4 is a timing diagram showing an operation of the semiconductor memory device shown in FIG. 3.

FIG. 4 is a timing diagram showing an operation of the semiconductor memory device shown in FIG. 3.

As shown, data outputted from the memory core are synchronized with the rising clock signal rclk and the falling clock signal folk in a data latch unit, and then the data are passed to a data output pad (DQ pad) to be outputted through the DQ pad in synchronization with a falling edge and a rising edge of the external clock signal CLK. That is, the rising clock signal rclk and the falling clock signal fclk are used as reference clock signals so that the data can be outputted in synchronization with the external clock signal CLK.

Figure 5:
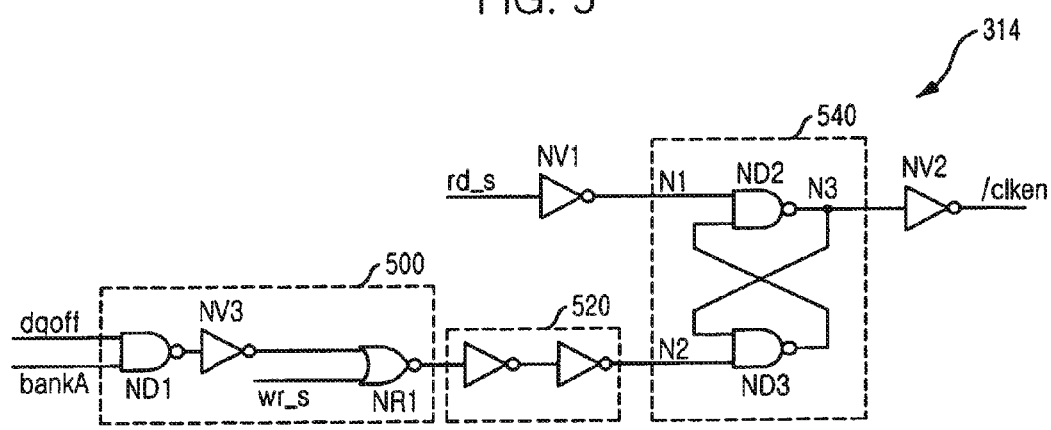
FIG. 5 is a schematic circuit diagram showing a clock controller shown in FIG. 3.

FIG. 5 is a schematic circuit diagram showing the clock controller 314 shown in FIG. 3.

As shown, the clock controller 314 includes a first inverter NV1, a second inverter NV2, a logic operation unit 500, a delay unit 520 and a latch unit 540.

The logic operation unit 500 receives the data output off signal dqoff, the bank active signal bankA and the write signal wr_s to perform a logic operation to the received signals.

In detail, the logic operation unit 500 includes a first NAND gate ND1 for performing a logic NAND operation to the data output off signal dqoff and the bank active signal bankA; a third inverter NV3 for inverting an output of the first NAND gate ND1; and a first NOR gate NR1 for performing a logic NOR operation to an output of the third inverter NV3 and the write signal wr_s.

The delay unit 520 delays an output of the logic operation unit 500 for the predetermined delay time dT. The predetermined delay time dT is for securing an enough time for stably and normally outputting data from the semiconductor memory device without being prevented by another operation according to a following command. Herein, the delay unit 520 includes even numbers of inverters, and the number of inverters included in the delay unit 520 is determined so that the predetermined delay time dT can correspond to from about a half clock cycle to about two clock cycles.

The first inverter NV1 inverts the read signal rd_s. The latch unit 540 latches an output of the first inverter NV1 and an output of the delay unit 520. The second inverter NV2 inverts an output of the latch unit 540.

In detail, the latch unit 540 includes a second NAND gate ND2 and a third NAND gate ND3. An output of the second NAND gate ND2 is coupled to an input of the third NAND gate ND3 and an output of the third NAND gate ND3 is coupled to an input of the second NAND gate ND2. The second and the third NAND gates ND2 and ND3 receive an output of the first inverter NV1 and an output of the delay unit 520 respectively.

Operations of the clock controller 314 are described below referring to FIG. 5.

When the write signal wr_s is in a logic high level and the read signal rd_s is in a logic low level at an initial state, a second node N2 is in a logic low level, the output of the third NAND gate is in a logic high level, the output of the second NAND gate is in a logic low level and the clock enable bar signal /clken is in a logic high level.

Thereafter, if the active command is inputted, the bank active signal bankA becomes in a logic low level. Then, when the read command is inputted, the write signal wr_s becomes in a logic low level and the second node N2 becomes in a logic high level. Since the read signal rd_s is activated as a high pulse according the read command, the first node N1 becomes in a logic low level. Therefore, the output of the second NAND gate ND2 becomes in a logic high level, whereby the clock enable bar signal /clken becomes in a logic low level.

Meanwhile, the clock enable bar signal /clken is changed to a logic high level when the write command is inputted or when the bank active signal bankA is in a logic high level and the data output off signal dqoff is in a logic high level. When the bank active signal bankA and the data output off signal dqoff are in a logic high level, none of the banks included in the semiconductor memory device is activated and no data is outputted from the semiconductor memory device.

Figure 6:
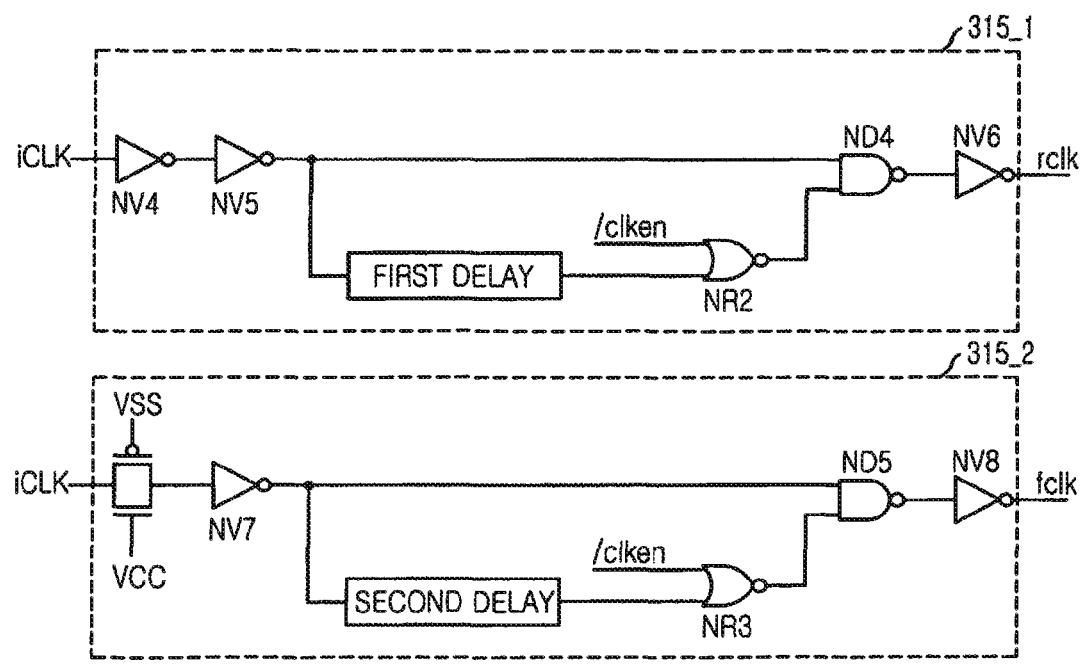
FIG. 6 is a schematic circuit diagram showing a clock signal generator shown in FIG. 3.

FIG. 6 is a schematic circuit diagram showing the clock signal generator 315 shown in FIG. 3.

As shown, the clock signal generator 315 includes a rising clock signal generator 315_1 and a falling clock signal generator 315_2. The rising clock signal generator 315_1 receives the internal clock signal iCLK for generating the rising clock signal rclk in response to the clock enable bar signal /clken. The falling clock signal generator 315_2 receives the internal clock signal iCLK for generating the falling clock signal fclk in response to the clock enable bar signal /clken.

In detail, the rising clock signal generator 315_1 includes a fourth inverter NV4 for inverting the internal clock signal iCLK; a fifth inverter NV5 for inverting an output of the fourth inverter NV4; a first delay for delaying an output of the fifth inverter NV5; a second NOR gate NR2 for performing a logic NOR operation to an output of the first delay and the clock enable bar signal /clken; a fourth NAND gate ND4 for performing a logic NAND operation to the output of the fifth inverter NV5 and an output of the second NOR gate NR2; and a sixth inverter NV6 for inverting an output of the fourth NAND gate ND4 to thereby generate the rising clock signal rclk.

The falling clock signal generator 315_2 includes a transfer gate TR for passing the internal clock signal iCLK; a seventh inverter NV7 for inverting an output of the transfer gate TR; a second delay for delaying an output of the seventh inverter NV7; a third NOR gate NR3 for performing a logic NOR operation to an output of the second delay and the clock enable bar signal /clken; a fifth NAND gate for performing a logic NAND operation to the output of the seventh inverter NV7 and an output of the third NOR gate NR3; and an eighth inverter NV8 for inverting an output of the fifth NAND gate ND5 to thereby generate the falling clock signal fclk.

Herein, a pulse width of the rising clock signal rclk corresponds to a delay amount of the first delay. Likewise, a pulse width of the falling clock signal fclk corresponds to a delay amount of the second delay.

FIG. 7 is a timing diagram showing operations of the semiconductor memory device shown in FIG. 3.

As shown, the clock enable bar signal /clken is activated as a logic low level when the read signal rd_s is activated as a high pulse. The clock enable bar signal /clken keeps its logic level as a logic low level for a predetermined time. The predetermined time corresponds to CAS latency (CL)+burst length (BL)+the predetermined delay time (dT).

Therefore, the rising clock signal rclk and the falling clock signal fclk for outputting data in synchronization with the external clock signal CLK are generated when the enable clock bar signal /clken is activated.

As a result, in comparison with the conventional semiconductor memory device, a reference clock signal for outputting data in synchronization with an external clock signal is generated only when the reference clock signal is needed for outputting data. Accordingly, a power consumption can be reduced and the semiconductor memory device according to the present invention is more suitable to a mobile device than the conventional memory device.

The present application contains subject matter related to Korean patent application No. 2004-113615, filed in the Korean Patent Office on Dec. 28, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A clock signal generation apparatus for generating a reference clock signal for outputting data in synchronization with an external clock signal from a semiconductor memory device, comprising:
 a clock signal generation unit for receiving the external clock signal to generate the reference clock signal in response to a control signal; and
 a control unit for generating the control signal based on a read command, a write command and an external address, wherein the write command is inactivated when a read command is inputted.

2. The clock signal generation apparatus as recited in claim 1, wherein the control signal is a logic LOW when activated and the control signal is a logic HIGH when inactivated.

3. The clock signal generation apparatus as recited in claim 1, wherein the control signal is in an activated state for a predetermined time after the control signal is activated in response to a read signal, wherein the predetermined time corresponds to a value of adding a predetermined delay time and a burst length (BL) to a column address strobe (CAS) latency.

4. The clock signal generation apparatus as recited in claim 3, wherein the predetermined delay time corresponds to from about a half clock cycle to about two clock cycles.

5. The clock signal generation apparatus as recited in claim 3, wherein the control signal is inactivated when a write signal is activated according to the write command.

6. The clock signal generation apparatus as recited in claim 1, wherein the control unit includes:
 a clock controller for generating the control signal according to a read signal, a write signal, a data output off signal and a bank active signal, wherein the read signal or the write signal is activated when the read command or the write command is inputted to the semiconductor memory device; and
 a mode register for generating the data output off signal and the bank active signal based on the read command and the external address.

7. The clock signal generation apparatus as recited in claim 6, wherein the control signal is inactivated when the bank active signal is in a logic high level and the data output off signal is in a logic high level.

8. The clock signal generation apparatus as recited in claim 7, wherein the bank active signal is in a logic low level when none of a plurality of banks included in the semiconductor memory device is activated.

9. The clock signal generation apparatus as recited in claim 8, wherein the data output off signal becomes in a logic low level after time corresponded to the CAS latency is passed after the read signal is activated according to the read command, and a logic level of the data output off signal is kept as a logic low level for the BL.

10. The clock signal generation apparatus as recited in claim 9, further comprising:
 a command signal receiver for receiving the external clock signal and a plurality of command signals to thereby generate an internal clock signal and transfers the plurality of command signals; and
 a command decoder for decoding the plurality of command signals outputted from the command signal to thereby generate the read signal and the write signal.

11. The clock signal generation apparatus as recited in claim 10, wherein the reference clock signal includes a first reference clock signal and a second reference clock signal and the clock signal generation unit includes:
 a first reference clock signal generator for receiving the internal clock signal to generate the first reference clock signal in synchronization with a rising edge of the internal clock signal according to the control signal; and
 a second reference clock signal generator for receiving the internal clock signal to generate the second reference clock signal in synchronization with a falling edge of the internal clock signal according to the control signal.

12. The clock signal generation apparatus as recited in claim 11, wherein the first reference clock signal generator includes:
 a first inverter for inverting the internal clock signal; a second inverter for inverting an output of the first inverter;
 a first delay for delaying an output of the second inverter;
 a first NOR gate for performing a logic NOR operation to an output of the first delay and the control signal;
 a first NAND gate for performing a logic NAND operation to the output of the second inverter and an output of the first NOR gate; and
 a third inverter for inverting an output of the first NAND gate to thereby generate the first reference clock signal.

13. The clock signal generation apparatus as recited in claim 11, wherein the first reference clock signal generator includes:
 a transfer gate for transferring the internal clock signal;
 a fourth inverter for inverting an output of the transfer gate;
 a second delay for delaying an output of the fourth inverter;
 a second NOR gate for performing a logic NOR operation to an output of the second delay and the control signal;
 a second NAND gate for performing a logic NAND operation to the output of the third inverter and an output of the second NOR gate; and
 a fifth inverter for inverting an output of the second NAND gate to thereby generate the second reference clock signal.

14. The clock signal generation apparatus as recited in claim 13, wherein a pulse width of the first reference clock signal and a pulse width of the second reference clock signal correspond to a delay amount of the first delay and a delay amount of the second delay respectively.

15. The clock signal generation apparatus as recited in claim 6, wherein the clock controller includes:
 a first inverter for inverting the read signal;
 a logic operation unit for performing a logic operation to the data output off signal, the bank active signal and the write signal;
 a delay unit for delaying an output of the logic operation unit for a predetermined delay time;
 a latch unit for latching an output of the first inverter and an output of the delay unit; and
 a second inverter for inverting an output of the latch unit to thereby generate the control signal.

16. The clock signal generation apparatus as recited in claim 15, wherein the logic operation unit includes:
 a first NAND gate for performing a logic NAND operation to the data output off signal and the bank active signal;
 a third inverter for inverting an output of the first NAND gate; and
 a NOR gate for performing a logic NOR operation to an output of the third inverter and the write.

17. The clock signal generation apparatus as recited in claim 16, wherein the delay unit includes even numbers of inverters.

18. The clock signal generation apparatus as recited in claim 17, wherein the latch unit includes:
a second NAND gate and a third NAND gate, the second NAND gate performing a logic NAND operation to the output of the first inverter and an output of the third NAND gate and the third NAND gate performing a logic NAND operation to the output of the delay unit and an output of the second NAND gate.

19. The clock signal generation apparatus as recited in claim 1, wherein the reference clock signal is held at a constant logic level when the control signal is inactivated.

20. The clock signal generation apparatus as recited in claim 19, wherein the constant logic level is a logic low level.

21. The clock signal generation apparatus as recited in claim 1, wherein the reference clock signal is a pair of reference clock signals.

22. The clock signal generation apparatus as recited in claim 21, wherein the pair of reference clock signals comprises a rising clock signal and a falling clock signal.

23. The clock signal generation apparatus as recited in claim 1, wherein the reference clock signal is generated without using a delay locked loop (DLL).

24. The clock signal generation apparatus as recited in claim 1, wherein the control signal is activated when the read command is received.

25. The clock signal generation apparatus as recited in claim 24, wherein the control signal is activated after a CAS latency following receipt of the read command.

26. The clock signal generation apparatus as recited in claim 25, wherein the control signal is inactivated after a burst length following activation of the control signal.

27. The clock signal generation apparatus as recited in claim 1, wherein the control signal is inactivated when the write command is received.

28. The clock signal generation apparatus as recited in claim 1, wherein the external address is an external bank address for selecting one of a plurality of banks.

29. The clock signal generation apparatus as recited in claim 28, wherein a predetermined bank is activated in response to the external bank address and an activate command.

30. The clock signal generation apparatus as recited in claim 29, wherein a bank activate signal is activated in response to the activate command and the external bank address for any one or more banks among the plurality of banks.

31. The clock signal generation apparatus as recited in claim 30, wherein the control signal is inactivated when the bank activate signal is inactivated.

32. A method for generating a reference clock signal for outputting data in synchronization with an external clock signal from a semiconductor memory device, the method comprising the steps of:
generating a control signal based on a read command, a write command and an external address; and
generating the reference clock signal based on an internal clock signal in response to the control signal, wherein the write command is inactivated when a read command is inputted.

33. The method as recited in claim 32, further comprising the steps of:
generating the internal clock signal based on the external clock signal; and
decoding a plurality of command signals inputted to the semiconductor memory device for generating a read signal and a write signal.

34. The method as recited in claim 33, wherein the step of generating the control signal includes the steps of:
generating a data output off signal and a bank active signal according to the read command and the external address; and
generating the control signal according to the read signal, the write signal, the data output off signal and the bank active signal.

35. The method as recited in claim 34, wherein the control signal is a logic LOW when activated and the control signal is a logic HIGH when inactivated.

36. The method as recited in claim 33, wherein the control signal is activated for a predetermined time, wherein the predetermined time corresponds to a value of adding a predetermined delay time and a burst length (BL) to a column address strobe (CAS) latency.

37. The method as recited in claim 36, wherein the step of generating the control signal includes the steps of:
performing logic operations to the data output off signal, the bank active signal and the write signal; and
delaying a result of the step of performing logic operations for the predetermined delay time.

38. The method as recited in claim 37, wherein the step of generating the reference clock signal includes the steps of:
generating a first reference clock signal based on the internal clock signal in synchronization with a rising edge of the internal clock signal according to the control signal; and
generating a second reference clock signal based on the internal clock signal in synchronization with a falling edge of the internal clock signal according to the control signal.

39. The method as recited in claim 32, wherein generating the reference clock signal further comprises holding the reference clock signal at a constant logic level when the control signal is inactivated.

40. The method as recited in claim 39, wherein the constant logic level is a logic low level.

41. The method as recited in claim 32, wherein generating the reference clock signal further comprises generating a pair of reference clock signals.

42. The method as recited in claim 41, wherein generating a pair of reference clock signals further comprises generating a rising clock signal and a falling clock signal.

43. The method as recited in claim 32, wherein generating the reference clock signal further comprises generating the reference clock signal without using a delay locked loop (DLL).

44. The method as recited in claim 32, wherein generating a control signal further comprises activating the control signal when the read command is received.

45. The method as recited in claim 44, wherein activating the control signal further comprises activating the control signal after a CAS latency following receipt of the read command.

46. The method as recited in claim 45, wherein generating a control signal further comprises inactivating the control signal after a burst length following activation of the control signal.

47. The method as recited in claim 32, wherein generating a control signal further comprises inactivating the control signal when the write command is received.

48. The method as recited in claim 32, wherein the external address is an external bank address for selecting one of a plurality of banks.

49. The method as recited in claim 48, the method further comprising activating a predetermined bank in response to the external bank address and an activate command.

50. The method as recited in claim 49, the method further comprising activating a bank activate signal in response to the activate command and the external bank address for any one or more banks among the plurality of banks.

51. The method as recited in claim 50, the method further comprising inactivating the control signal when the bank activate signal is inactivated.

52. A clock signal generation apparatus for generating a reference clock signal for outputting data in synchronization with an external clock signal from a semiconductor memory device, comprising:
  a clock signal generation unit for receiving the external clock signal to generate the reference clock signal in response to a control signal; and
  a control unit for generating the control signal based on a read command, a write command and an external address, wherein the control signal is in an activated state for a predetermined time after the control signal is activated in response to the read command, wherein the predetermined time corresponds to a value of adding a predetermined delay time and a burst length (BL) to a column address strobe (CAS) latency, and wherein the write command is inactivated when a read command is inputted.

53. The clock signal generation apparatus as recited in claim 52, wherein the control signal is a logic LOW when activated and the control signal is a logic HIGH when inactivated.

* * * * *